United States Patent
Nakamura

[11] Patent Number: 5,208,167
[45] Date of Patent: May 4, 1993

[54] METHOD FOR PRODUCING SOI SUBSTRATE

[75] Inventor: Tomofumi Nakamura, Kyoto, Japan

[73] Assignee: Rohm Co., Ltd., Kyoto, Japan

[21] Appl. No.: 901,629

[22] Filed: Jun. 19, 1992

[30] Foreign Application Priority Data

Sep. 30, 1991 [JP] Japan .................................. 3-251916
Sep. 30, 1991 [JP] Japan .................................. 3-251917

[51] Int. Cl.$^5$ .................... H01L 21/265; H01L 21/20
[52] U.S. Cl. ........................................ 437/21; 437/89; 437/83; 437/84; 437/62
[58] Field of Search ........................ 437/89, 21, 83, 84, 437/228

Primary Examiner—Olik Chaudhuri
Assistant Examiner—Ramamohan R. Paladugu
Attorney, Agent, or Firm—Nikaido, Marmelstein, Murray & Oram

[57] ABSTRACT

A method for producing a SOI substrate comprising: a step of forming a first opening to an insulating film on a semiconductor substrate and then forming semiconductor crystal layer by epitaxial growth over the first opening and the insulating film; a step of forming a second opening by partially removing the semiconductor crystal layer; a step of forming an integrated insulating film, and a step of forming an integrated semiconductor crystal layer. With the present invention, a semiconductor crystal layer can be formed on an insulating film on a substrate with large area, wherein the crystal layer and the substrate is completely insulated from each other. Further even from such materials as hard to form monocrystal substrate, a substrate can be easily obtained.

4 Claims, 4 Drawing Sheets

METHOD FOR PRODUCING SOI SUBSTRATE

BACKGROUND OF THE INVENTION

The present invention relates to a method for producing a SOI substrate, and more particularly to a method for producing a SOI substrate wherein a semiconductor crystal layer is formed on an insulating film formed on a semiconductor substrate by epitaxial growth with using a semiconductor crystal of the substrate as a seed.

In this specification, the word SOI means a semiconductor crystal layer on an insulating film and widely represents semiconductors, which of course are not limited to silicon semiconductors.

SOI substrates has been produced conventionally by SIMOX (Separation by Implanted Oxygen) method, where oxygen atom is implanted to a semiconductor crystal substrate and then an insulating film is formed in the substrate by heat treatment, or by epitaxial growth method, where an opening is formed at an insulating film formed on a semiconductor substrate and then a semiconductor crystal layer is formed by epitaxial growth on the insulating film with using the semiconductor crystal of the substrate exposed through the opening as a seed.

A cross section of a conventional SOI substrate formed by epitaxial growth is shown in FIG. 4. This SOI substrate is produced as follows. An insulating film 2 is formed on a semiconductor substrate 1. An opening 3 is formed at the insulating film 2 with a resist film. Semiconductor crystal epitaxially grows from the semiconductor crystal exposed through the opening 3. The opening 3 is filled with the semiconductor crystal layer 4. The layer 4 further epitaxially grows on the upper surface of the insulating film 2 to finally form a SOI substrate wherein a semiconductor crystal layer is formed on an insulating film.

However, the conventional SIMOX method for producing a SOI substrate has a problem of semiconductor crystal damage (crystal defect) due to oxygen atom implantation. Further, in the conventional epitaxial growth method where an opening is formed at an insulating film on a semiconductor substrate and through the opening epitaxial growth is performed to form a semiconductor crystal layer, a satisfactory SOI substrate can not be obtained, because the semiconductor substrate is utilized as a seed for epitaxial growth whereby the crystal layer and the substrate connect with each other through the opening of the insulating film. In order to obtain a complete SOI substrate, a region including the opening must be removed, so that the SOI substrate undesirably becomes small.

In view of the above-mentioned problems, an object of the present invention is to provide a method for producing a substrate having a SOI structure wherein a semiconductor crystal layer by epitaxial growth on an insulating film and a semiconductor substrate under the insulating film are completely insulated from each other.

Another object of the present invention is to provide a substrate having a large SOI structure without any openings and to facilitate insulation between semiconductor layers in a three-dimensional IC by arranging the SOI substrates in a lamination.

Further object of the present invention is to provide a producing method by which a SOI substrate is easily made even from a semiconductor material which is hard to form monocrystal substrate.

SUMMARY OF THE INVENTION

According to the present invention there is provided a method for producing a SOI substrate comprising: a step wherein a first opening is formed at an insulating film formed on a semiconductor substrate and then a semiconductor crystal layer is formed over the first opening and the insulating film by epitaxial growth with using the semiconductor crystal of the substrate exposed through the first opening as a seed; a step wherein a second opening is formed by removing the semiconductor crystal layer formed in the first opening; a step wherein another insulating film is formed on the exposed semiconductor substrate through the second opening to be integrated with the insulating film; and a step wherein on the another insulating film formed in the second opening semiconductor crystal is further formed by epitaxial growth in the transverse direction with using the semiconductor crystal by epitaxial growth as a seed to form a semiconductor crystal layer integrated with the semiconductor crystal layer.

According to the present invention there is also provided a method for producing a SOI substrate comprising: a step wherein a first opening is formed at an insulating film formed on a semiconductor substrate and then a semiconductor crystal layer is formed over the first opening and the insulating film by epitaxial growth with using the semiconductor crystal of the substrate exposed through the first opening as a seed; a step wherein a second opening is formed by removing the semiconductor crystal layer formed in the first opening; a step wherein another insulating film is formed on the exposed semiconductor substrate through the second opening to be integrated with the insulating film; a step wherein an silicon oxide film formed on the semiconductor crystal layer during formation of the another insulating film is removed; and a step wherein on the another insulating film formed in the second opening and on the semiconductor crystal layer, semiconductor crystal is further formed by epitaxial growth with using the semiconductor crystal formed by epitaxial growth as a seed.

In the present invention, a semiconductor crystal layer is formed by epitaxial growth in an opening formed at an insulating film with using semiconductor substrate exposed through the opening as a seed, and then the epitaxial growth layer in the opening is removed. Thereafter another insulating film and another semiconductor crystal layer are formed by epitaxial growth. For this reason, the semiconductor crystal layer by epitaxial growth on the insulating film is completely insulated from the substrate under the insulating film so that a SOI substrate having a large area can be obtained.

In the present invention described in claim 4, at forming an insulating film in an opening, the insulating film is formed also on an epitaxial growth layer of semiconductor crystal. Thereafter the insulating film on the epitaxial growth layer is removed and again semiconductor crystal layer is formed by epitaxial growth over the opening and the semiconductor crystal layer. For this reason, the number of steps can be reduced and a thick semiconductor crystal layer can be obtained.

DETAILED DESCRIPTION

Figure 1:
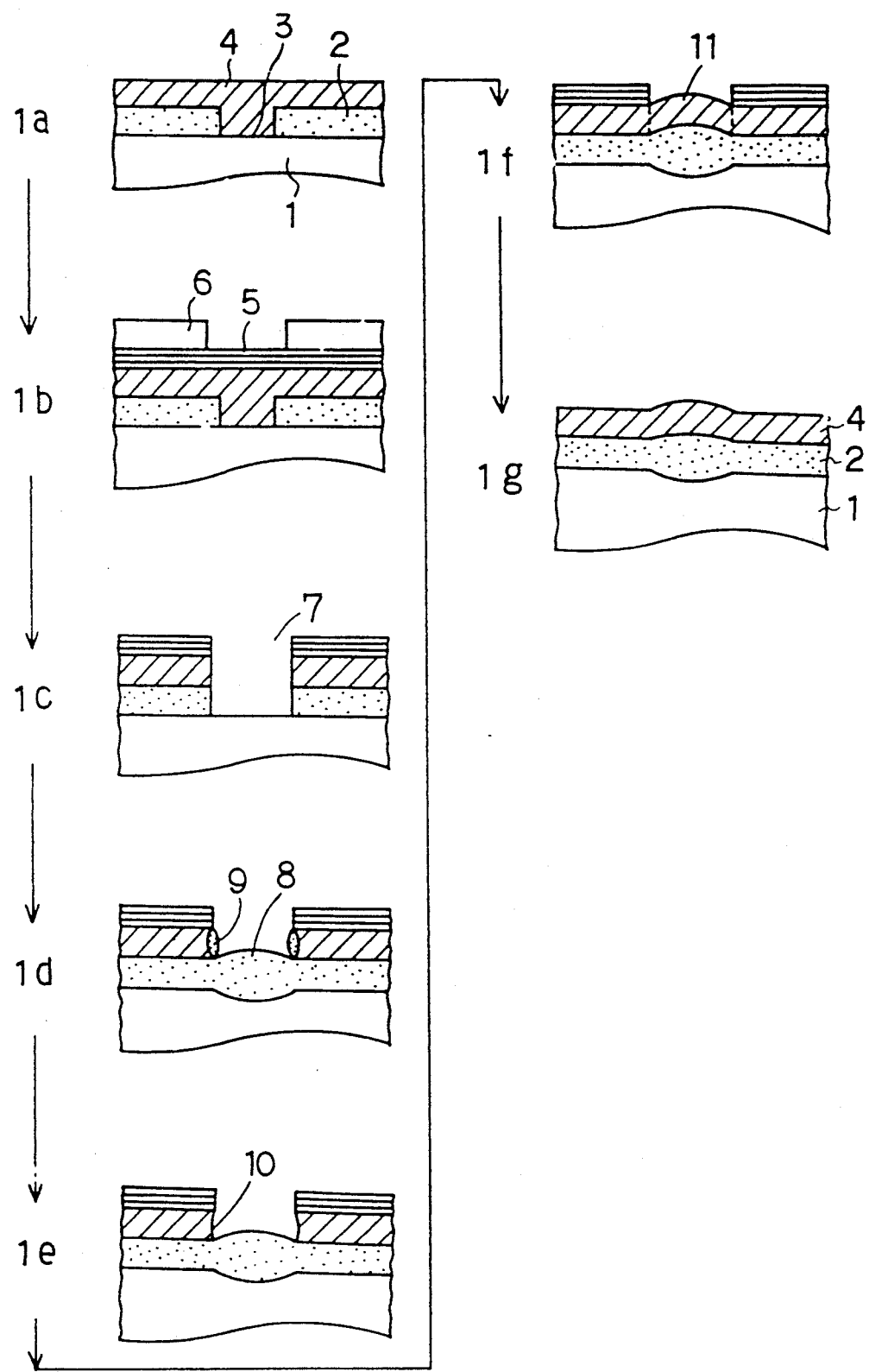
FIG. 1a–g is an explanatory view of a method for producing a SOI substrate according to the present invention.

Hereinafter, a method for producing a SOI substrate of the present invention is explained with reference to the attached drawings. FIG. 1 shows an embodiment of steps of the method for producing a SOI substrate.

As shown in step 1a in FIG. 1, a first opening 3 is formed at an insulating film 2 formed on a semiconductor substrate 1, and a semiconductor crystal layer 4 is formed by epitaxial growth over the first opening 3 and the insulating film 2 with using the crystal of the semiconductor substrate 1 as a seed. Concretely, a silicon oxide film as the insulating film 2 is formed on the silicon semiconductor substrate 1, for example by CVD method, to have a thickness of 0.5 μm. Then the first opening 3 is formed by partially etching with a photoresist. A silicon carbide (SiC) layer as the semiconductor crystal layer 4 is formed by epitaxial growth with using the silicon semiconductor substrate exposed through the first opening 3 as a seed. Because silicon carbide has the same characteristics as silicon, silicon carbide epitaxially grows with using the silicon crystal of the exposed semiconductor substrate as a seed. Accordingly, silicon carbide epitaxially grows at first selectively in the longitudinal direction only in the opening 3 obtained by etching the silicon oxide film. When the epitaxial growth of silicon carbide in the first opening 3 is completed to reach the top surface of the silicon oxide film, silicon carbide epitaxially grows successively on the insulating film 2 simultaneously in the transverse and longitudinal directions. Thus the semiconductor crystal layer 4 of silicon carbide is formed, as shown in step 1a.

A second opening 7 is formed by removing the portion of the semiconductor crystal layer 4 formed in the first opening 3, as shown in steps 1b and 1c. Concretely, a silicon nitride film as the oxidation-resistant film 5 is formed, for example by CVD method, on the semiconductor crystal layer 4 of silicon carbide to have a thickness of 0.1 μm. Then the silicon nitride film is coated with a resist film 6, and a resist pattern is formed with a mask larger than the opening 3 by a margin for alignment, as shown in step 1b. The portions of the silicon nitride film and the semiconductor crystal layer 4 of silicon carbide corresponding to the opening of the resist film 6 are removed by reactive ion etching (RIE) with the patterned resist film serving as a mask to form the second opening 7, as shown in step 1c.

Subsequently, an insulating film 8 is formed on the exposed area of the semiconductor substrate 1 through the second opening 7, whereby the insulating film 8 is integrated with the insulating film 2 formed in the step 1a. Concretely, the resultant substrate is subjected to heat treatment at 1000° C. for 70 minutes, whereby the exposed semiconductor substrate 1 of silicon is oxidized to form an oxide film (namely insulating film 8) almost as thick as the insulating film 2 formed in the step 1a. In this step, the upper surface of the silicon carbide crystal growth layer is not oxidized thanks to the oxidation-resistant film 5, but the side surface thereof in the second opening 7 is oxidized to form an oxide film 9 of crystal growth layer. However, the oxidation rate of silicon carbide is as low as about 1/5 of that of silicon. As a result, the thickness of the oxide film 9 of crystal growth layer on the side surface is very thin as shown in step 1d. The insulating film 8 may be formed by CVD method or the like instead of by oxidation.

A second semiconductor crystal layer 11 is formed on the insulating film 8 formed in the step 1d by further epitaxial growth in the transverse direction with using the semiconductor crystal layer 4 as a seed, as shown in steps 1e, 1f and 1g. Thus, the second semiconductor crystal layer 11 is integrated with the semiconductor crystal layer 4 formed in the step 1a, to form another semiconductor crystal layer which is on the insulating film 8 and not connected to the semiconductor substrate 1. Concretely, the oxide film 9 of crystal growth layer is removed by wet etching with 9% hydrofluoric solution so that the etching does not damage the side surface of the silicon carbide growth layer formed by epitaxial growth, whereby a side crystal surface 10 is exposed as shown in step 1e. This step can be omitted if the insulating film 8 is formed by CVD method in the step 1d.

Thereafter, disilane ($Si_2H_6$) and acetylene ($C_2H_2$) is introduced to carry out vapor phase growth. Then, semiconductor crystal of silicon carbide epitaxially grows laterally only from the exposed side of the crystal surface 10, whereby the second semiconductor crystal layer 11 of silicon carbide is formed on the insulating film 8 in the second opening 7 to clog the second opening 7 as shown in the step 1f. In this step, the silicon carbide crystal growth layer does not epitaxially grow in a longitudinal direction because the oxidation-resistant film 5 (namely silicon nitride film) exists on the upper surface of the growth layer.

The oxidation-resistant film 5 is removed by etching with an etching solution such as phosphoric acid showing a higher selective corrosion for silicon nitride than for silicon carbide, that is, with an etching solution showing a much higher etching rate in etching the silicon nitride film (oxidation resistant film 5) than in etching the silicon carbide layer (second semiconductor crystal growth layer 11) formed by epitaxial growth. Thus the formation of a substrate of SOI structure is completed.

In the embodiment described above, the silicon nitride film (oxidation-resistant film 5) is formed on the surface of the silicon carbide crystal growth layer formed by epitaxial growth, and removed in the final step. However, in case that semiconductor crystal such as silicon carbide showing an oxidizing rate much lower than silicon is formed, there are no problems if the second opening 7 is formed with a conventional mask, the mask is removed and the remaining steps are performed, because the semiconductor crystal layer surface suffers little oxidation thanks to its low oxidizing rate.

Figure 2:
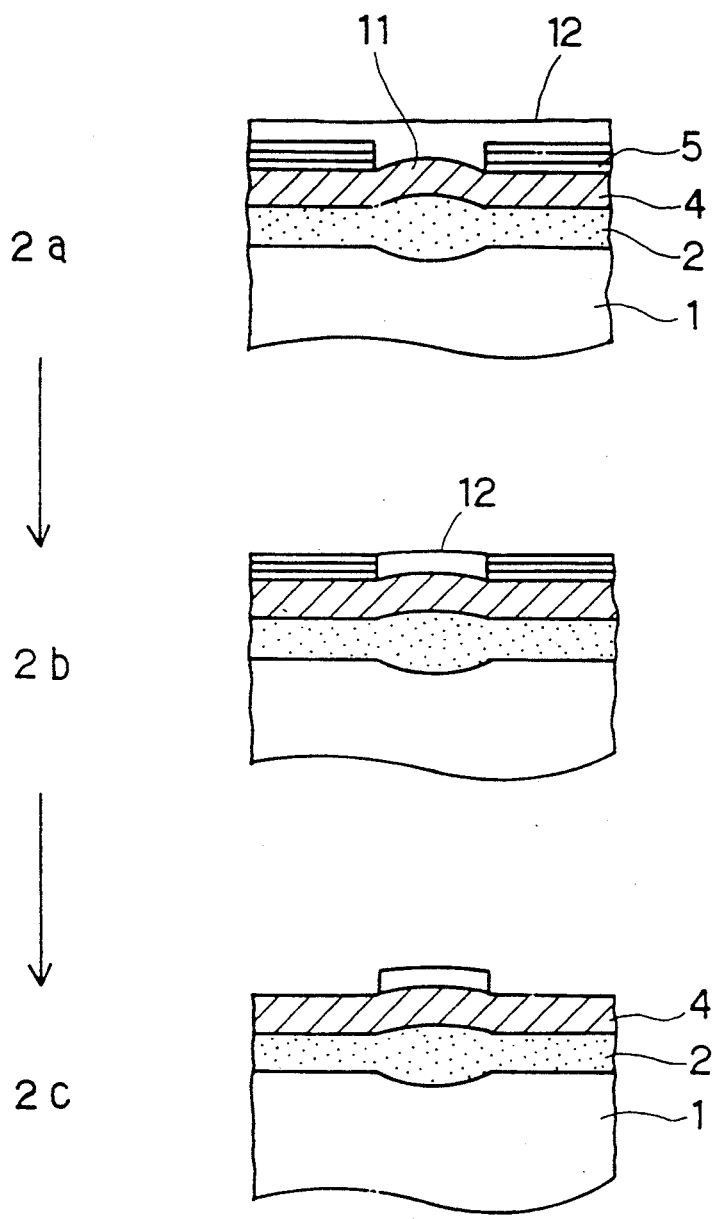
FIG. 2a–c is an explanatory view showing a step of removing an oxidation-resistant film in the steps of FIG. 1.

In the above embodiment, the oxidation-resistant film 5 is removed at the final stop with an etching solution showing a higher selective corrosion for the oxidation-resistant film 5 than for the second semiconductor crystal layer. However, there are some cases where such an etching solution cannot be obtained, depending on the material of the semiconductor crystal layer and the oxidation-resistant film. In that case, removal of the oxidation-resistant film 5 is carried out with steps shown in FIG. 2.

The substrate having the second semiconductor crystal growth layer 11 in the step 1f is entirely coated with a resist film 12, as shown in step 2a.

Since etching back by RIE method uniformly removes the entire resist film 12 from the upper surface thereof, the resist film 12 remains only on the surface of the second semiconductor crystal layer 11 as shown in step 2b, when the resist film 12 is etched back until the surface of the oxidation-resistant 5 is exposed.

In this condition the oxidation-resistant film 5 is removed, for example by RIE method with using the resist film 12 as a mask as shown in step 2c. Thereafter, the remaining resist film 12 is removed by corrosion to obtain a complete SOI substrate.

Figure 3:
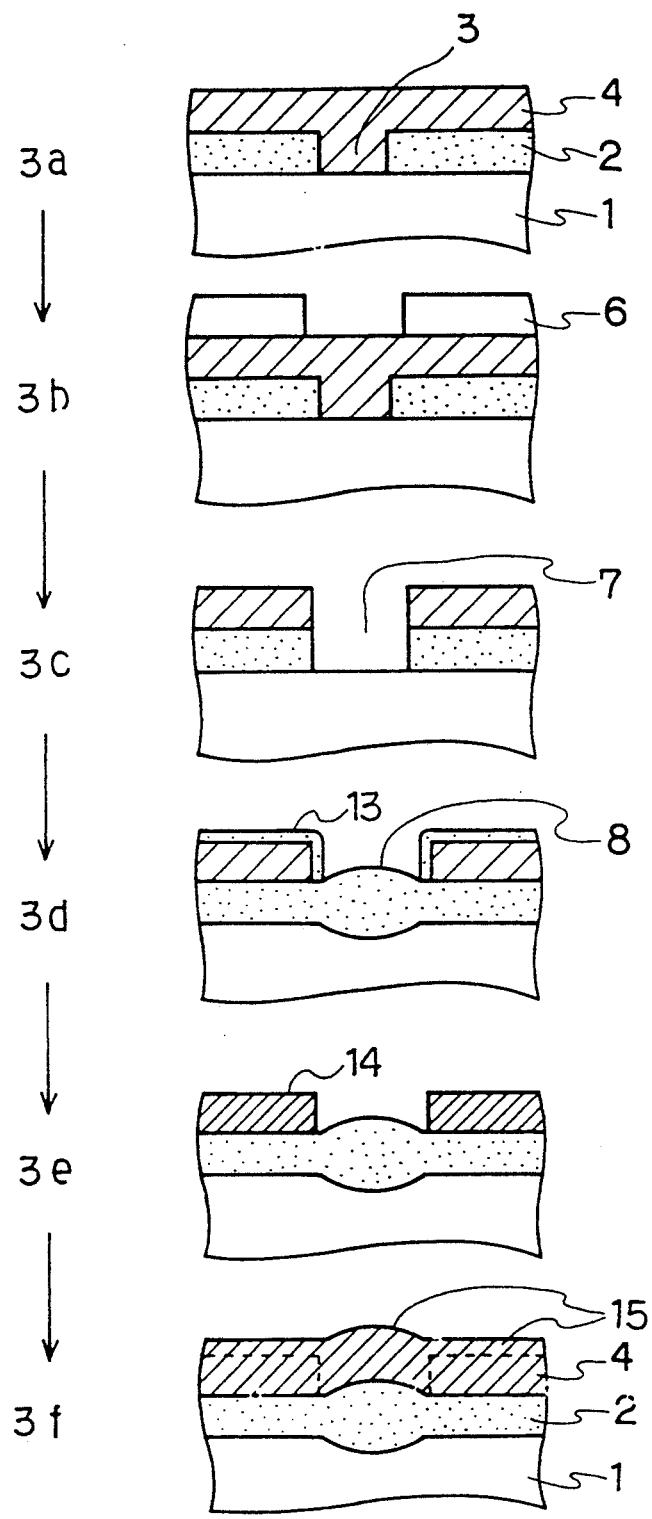
FIG. 3a–f is an explanatory view of another method for producing a SOI substrate according to the present invention.
Figure 4:
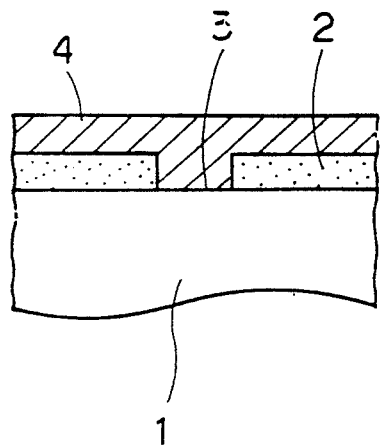
FIG. 4 is a cross section of a SOI substrate produced by a conventional method with epitaxial growth.

Another embodiment of the present invention is explained below. FIG. 3 shows another embodiment of the present invention. In FIG. 3, other steps of a method for producing a SOI substrate is shown.

As shown in step 3a, similarly to the first embodiment, a first opening 3 is formed at an insulating film 2 formed on a semiconductor substrate 1, and a semiconductor crystal layer is formed by epitaxial growth over the first opening 3 and the insulating film 2 with using the crystal of the substrate 1 as a seed.

As shown in steps 3b and 3c, a semiconductor crystal layer 4 on the opening 3 is removed to form a second opening 7. Concretely, a resist film 6 is applied to the surface of the semiconductor crystal layer 4 of silicon carbide with a mask to form a resist pattern. This mask is larger than the opening 3 by a margin for alignment. Then, the semiconductor crystal layer 4 of the silicon carbide exposed through the resist film 6 is removed by RIE method with the patterned film 6 serving as a mask to form the second opening 7 as shown in step 3c.

An insulating film 8 is formed on the exposed semiconductor substrate 1 through the opening 7 to be integrated with the insulating film 2 formed in step 3a. This embodiment is similar to the first embodiment except that any oxidation-resistant film is not applied to the layer 4 so that a thin oxide film 13 is formed not only on the side surface of the layer 4 in the opening 7 but also on the upper surface of the layer 4 as shown in step 3d.

As shown in step 3e, the oxide film 13 of crystal growth layer formed on the upper surface of the layer 4 and on the side surface of the layer 4 in the opening 7 is removed. Concretely, this is carried out similarly to the first embodiment. In this step 3e the upper surface 14 of the silicon carbide growth layer is also exposed.

Thereafter, a second semiconductor crystal layer 15 of silicon carbide is formed by epitaxial growth. The semiconductor crystal layer 15 epitaxially grows horizontally in the opening 7 and further epitaxially grows vertically with using the exposed upper surface of the layer 4 and the epitaxial growth layer in the opening 7 as a seed. Concretely, this is carried out similarly to the first embodiment except that a vertical epitaxial growth on the exposed surface of the layer 4 is also realized to form the second layer 15 so that the opening 7 is clogged and the layer 15 is formed thicker than that in the first embodiment as shown in step 3f. In this step no useless film such as oxidation-resistant film exsists on the silicon carbide crystal layer. Thus the production of a SOI substrate is completed.

In this embodiment, a semiconductor crystal layer of silicon carbide is formed on a silicon semiconductor substrate by epitaxial growth and formation of the insulating film 8 in the step 3d is performed by oxidation. In this case, because the oxidation rate of silicon carbide is low, the layer 4 can be exposed by only removing the thin oxide film. However, the present method is not limited to this. For example in case that a silicon semiconductor crystal layer is formed on an insulating film with using a silicon semiconductor substrate as a seed, a thick oxide film is formed because the substrate and the crystal layer have a same oxidation rate, if an insulating film is formed in an opening by oxidation. In order to remove this thick oxide film by corrosion, it is necessary to mask the insulating film in the opening so that this region is not heavily subjected to corrosion. Further in this case it is necessary to form the layer 4 thick previously because the layer 4 is much removed by corrosion. If these are considered well, even in case that a silicon semiconductor is formed on an insulating film on a silicon semiconductor substrate, the present invention can be applied there.

In this embodiment, a semiconductor crystal layer by epitaxial growth can be formed on an insulating film over large area with a few steps, because complicated steps of forming and removing oxidation-resistant film or the like is unnecessary.

In the above-mentioned first and second embodiments, a semiconductor crystal layer of silicon carbide by epitaxial growth is formed on an insulating film on a silicon substrate, however, semiconductor material is not limited to those. For example, the materials for the substrate and the crystal layer can be replaced with each other, or the same material can be used therefor. Further as these materials there can be employed SiGe, compound semiconductors such as Al GaAs and the like other than Si and SiC.

As explained above, according to the present invention a semiconductor crystal layer by epitaxial growth can be formed on an insulating film over large area. Further the layer by epitaxial growth can be completely insulated from the substrate. Thus, a SOI substrate as large as that produced by SIMOX method can be obtained.

In the present invention, a semiconductor crystal layer can be formed on a insulating film by epitaxial growth, so even in the case of SiC material, with which a monocrystal substrate is hard to be formed, a substrate can be easily formed on an insulating film with using a semiconductor substrate of the same kind of material as a seed.

In the present invention, a SOI substrate can be formed in the same process as that of a semiconductor device. For this reason, an IC circuit is formed on a semiconductor substrate, and an insulating film and a semiconductor crystal layer are formed thereon in this order to form another IC circuit. Thus a three-dimensional semiconductor device wherein many semiconductor substrates having IC circuit are superimposed can be obtained.

Though several embodiments of the invention are described above, it is to be understood that the present invention is not limited to the above-mentioned embodiments, and various changes and modifications may be made in the invention without departing from the spirit and scope thereof.

What is claimed is:

1. A method for producing a SOI substrate comprising:

a step wherein a first opening is formed at an insulating film formed on a semiconductor substrate and then a semiconductor crystal layer is formed over the first opening and the insulating film by epitaxial growth with using the semiconductor crystal of the substrate exposed through the first opening as a seed;

a step wherein a second opening is formed by removing the semiconductor crystal layer formed in the first opening;

a step wherein another insulating film is formed on the exposed semiconductor substrate through the second opening to be integrated with the insulating film; and a step wherein on the another insulating film formed in the second opening semiconductor crystal is further formed by epitaxial growth in the transverse direction with using the semiconductor crystal by epitaxial growth as a seed to form a semiconductor crystal layer integrated with the semiconductor crystal layer.

2. The method of claim 1, wherein the step of forming the second opening comprises:

a step wherein on the whole surface of the semiconductor crystal layer by epitaxial growth, an oxidation-resistant film is formed, and a step wherein the oxidation-resistant film and the semiconductor crystal layer are partially removed with a resist mask, the oxidation-resistant film being removed after the semiconductor crystal layer is formed on the insulating film in the second opening.

3. The method of claim 2, wherein the removal of the oxidation-resistant film is performed by:

a step wherein a resist film is applied over the semiconductor crystal layer formed in the second opening and the oxidation-resistant film, a step wherein the resist film on the oxidation-resistant film is removed by etching back so that the resist film on the semiconductor crystal layer remains thereon, and a step wherein the oxidation-resistant film is removed and thereafter the resist film remaining on the semiconductor crystal layer is removed.

4. A method for producing a SOI substrate comprising:

a step wherein a first opening is formed at an insulating film formed on a semiconductor substrate and then a semiconductor crystal layer is formed over the first opening and the insulating film by epitaxial growth with using the semiconductor crystal of the substrate exposed through the first opening as a seed;

a step wherein a second opening is formed by removing the semiconductor crystal layer formed in the first opening;

a step wherein another insulating film is formed on the exposed semiconductor substrate through the second opening to be integrated with the insulating film;

a step wherein an silicon oxide film formed on the semiconductor crystal layer during formation of the another insulating film is removed; and a step wherein on the another insulating film formed in the second opening and on the semiconductor crystal layer, semiconductor crystal is further formed by epitaxial growth with using the semiconductor crystal formed by epitaxial growth as a seed.

* * * * *